United States Patent [19]

Beerlage

[11] Patent Number: 4,906,850
[45] Date of Patent: Mar. 6, 1990

[54] RADIOGRAPHIC IMAGE DETECTION DEVICE

[75] Inventor: Meindert J. M. Beerlage, Pijnacker, Netherlands

[73] Assignee: BV Optische Industrie "De Oude Delft", Delft, Netherlands

[21] Appl. No.: 197,105

[22] Filed: May 20, 1988

Related U.S. Application Data

[63] Continuation-in-part of Ser. No. 79,084, Jul. 27, 1987.

[30] Foreign Application Priority Data

Aug. 7, 1986 [NL] Netherlands .......................... 8602021

[51] Int. Cl.$^4$ ................................................ G01T 1/20
[52] U.S. Cl. ............................ 250/370.09; 250/370.11
[58] Field of Search .................... 250/370.09, 370.11, 250/483.1, 487.1, 367

[56] References Cited

U.S. PATENT DOCUMENTS

| | | | |
|---|---|---|---|
| 3,936,645 | 2/1976 | Iversen | 250/370.11 |
| 4,234,792 | 11/1980 | DeCou | 250/370.09 |
| 4,672,207 | 1/1987 | Derenzo | 250/370.11 |
| 4,734,588 | 3/1988 | Akai | 250/370.11 |

Primary Examiner—Janice A. Howell
Assistant Examiner—Richard Hanig
Attorney, Agent, or Firm—Louis E. Marn

[57] ABSTRACT

There is disclosed a radiographic image detection device comprised of a semiconductive matrix having rows and columns of radiation sensitive areas, a protective layer formed on the semiconductive matrix and having lands or land portions defined by grooves corresponding to areas between the rows and columns of the sensitive areas and crystals capable of adsorbing X-ray radiation disposed on the lands or land portions of the protective layer.

5 Claims, 1 Drawing Sheet

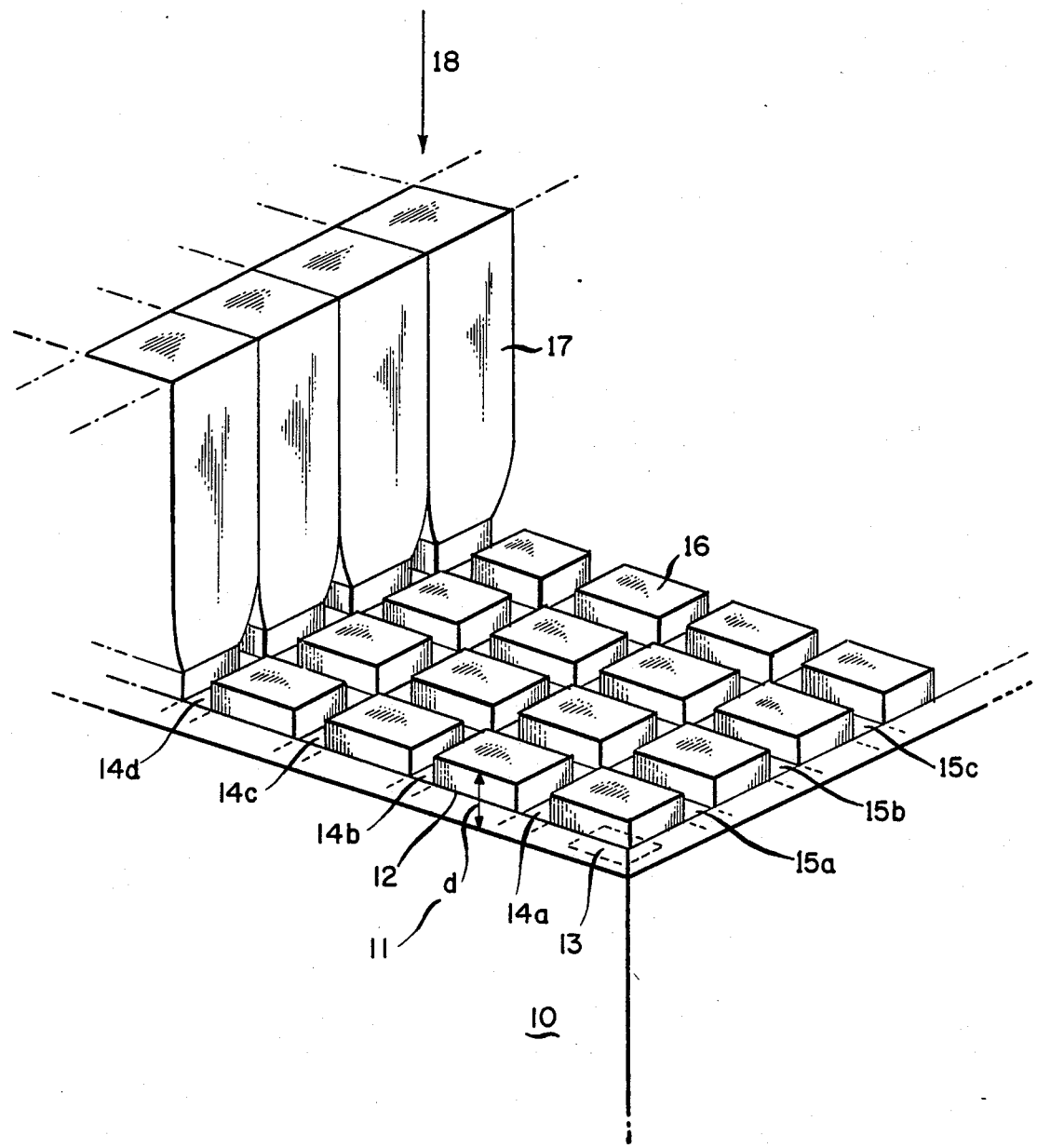

RADIOGRAPHIC IMAGE DETECTION DEVICE

BACKGROUND OF THE INVENTION (1) Related Application

This is a continuation-in-part of U.S. Application Ser. No. 07/079,084, filed July 27, 1987.

(2) Field of the Invention

The invention relates to an image detection device, and more particularly to a radiographic image detection device.

(3) Description of the Prior Art

In radiography, it is known from U.S. Pat. No. 4,179,100 to direct a flat fan-shaped beam of X-ray radiation via a body to be examined to an image-recording device comprised of a large number of aligned image-recording elements. In such process, each image-recording element receives radiation, which may or may not have been further processed and which has been transmitted through a corresponding part of the body to be examined. In further processing, the radiation may, for example, be converted into visible light in an X-ray detector before being received by an image-recording device.

In an image-recording device comprised of a large number of aligned image-recording elements having dimensions of, for example, $0.1 \times 0.1$ mm$^2$, exposure time for each image-recording element is extremely short for the usual scanning speeds of a body to be examined. As a result, the signal/noise ratio of the image obtained is very poor or the source load has to be increased to undesirably higher levels to obtain a better signal/noise ratio. In order to obtain an acceptable signal/noise ratio with a relatively low source load it is necessary to use the X-ray source more efficiently than is possible with a fan-shaped beam having a thickness no greater than one image-recording element.

In U.S. Pat. No. 4,383,327 to Kruger, there is disclosed the use of an image-recording device comprised of a matrix having rows and columns of image-recording elements in which the charge produced during a given period in a given image-recording element as a result of the radiation received by said element during said period is transferred during a read period to an adjacent associated vertical shift register effected during the read period for all the image-recording elements in each row. At the same time between successive periods, a relative movement is brought about between the body and the image-recording device so that during the next period the same part of the body to be examined, that is to say the same row of image points of the body to be examined, is imaged on the next row of image-recording elements. It is also possible in a manner, known per se, to combine the function of converting radiation into a charge and the function of transporting a charge in a vertical CCD shift register.

The charge in the shift register is carried along so that a charge is accumulated in the associated shift register during successive periods by successive image-recording elements in a column. The accumulated charge is the sum of the charge which is transmitted through a specific part (an image point) of the body to be examined during successive periods. A horizontal shift register may be mounted on one end of the columns for successively reading out and delivering in sequence the information of the adjacent columns to an output terminal. The information thus always represents the sum of the information from all the image-recording elements in each of the columns for an image point.

This method of scanning is termed TDI (Time Delay and Integration) and is found to be of particularly good applicability in the examination of bodies by means of X-ray radiation, it being possible for a usable image to be formed despite the fact that each image-recording element, per se, generates only a very small amount of charge in response to the radiation received. For a comprehensive discussion of the TDI principle, reference is made to such in U.S. Pat. No. 4,383,327.

For converting the incident X-ray radiation on the image-recording device into visible light which can be detected by the photodiodes and can be converted by these into an electrical signal corresponding to the detected quantity of light, and hence with the incident X-ray radiation, use can be made of cesium iodide (CsI) which is applied by vapor deposition in a layer on the surface of the image-recording device, or matrix of the image-recording elements. Because X-ray radiation has an adverse effect on the properties of semi-conductors, i.e. the photodiodes, the thickness of the layer of CsI is preferably provided as large as possible in order to minimize X-ray radiation passing through to the photodiodes. This has the further advantage that as much radiation as possible is adsorbed in the CsI, which radiation thus contributes to a signal. A thick layer of CsI has the result, however, that a high degree of diffusion of the visible light formed occurs in this layer as a consequence of which the modulation transfer function (MTF) and hence also the quality considerably deteriorates the detected X-ray image.

SUMMARY OF THE INVENTION

The objects of the present invention are achieved by a radiographic image detection device comprised of a semiconductive matrix having rows and columns of radiation sensitive areas, a protective layer formed on the semiconductive matrix and having lands or land portions defined by grooves corresponding to areas between the rows and columns of the sensitive areas and crystals capable of adsorbing X-ray radiation disposed on the lands or land portions of the protective layer.

BRIEF DESCRIPTION OF THE DRAWING

Other objects and advantages of the present invention will become more apparent from the following detailed description when taken with the accompanying drawing of an enlarged isometric view of a portion of a radiographic image detection device of the present invention.

DETAILED DESCRIPTION OF THE INVENTION

Referring now to the drawing, there is illustrated a solid-state, image detection device, generally indicated as 10, comprised of a semiconductive matrix 11 covered by a protective layer 12. In the semiconductive matrix 11, radiation sensitive areas 13 are arranged in a matrix of rows and columns. Each radiation sensitive area 13 is surrounded by an area insensitive to radiation in which control lines are present which carry control signals under the influence of which image information in the form of charges generated by the radiation in each radiation sensitive area 13 is transported to a side of the device to be read out in a manner known, per se. The protective layer 12 of an initial thickness d is provided in a manner known per se, with a plurality of parallel grooves in rows and columns $14a, \ldots, 14d$ and $15a, \ldots$ , 15d, respectively. It should be noted that the dimensions of the grooves shown in the drawing are not to scale relative to the dimension of the protective layer 12. The grooves enclosed lands or land portions, one of which is denoted by the reference numeral 16, of the material of the protective layer 12, which may be, e.g. SiO$_2$ or Si$_3$N$_4$, or a mixture thereof. The grooves are positioned above the insensitive areas surrounding the sensitive areas 13 thereby leaving the lands or land portions 16 disposed above the radiation sensitive areas 13.

After the grooves have been made in the protective layer 12, the device is subjected to vapor deposition of cesium iodide (CsI). Cesium iodide (CsI) crystals (one of which is denoted by referenced numeral 17) are formed on respective land or land portion 16 whereby crystals on adjacent lands or land portions 16 possess different crystal orientations. As the vapor deposition process continues and the CsI layer became thicker, the CsI layers on adjacent lands or land portions 16 in fact grow relative to each other, because with increasing thickness the dimensions also increased parallel to the surface of the device 10 but without growing into each other because of the different crystal orientations of the CsI on adjacent lands or land portions 16. There is only a minimum of interchange of light between the CsI crystals on adjacent lands or land portions 16.

As a result, any X-ray radiation, for example, penetrating a CsI crystal 17 from above in the direction of arrow 18 generates light within that crystal 17. At any site wherein X-ray radiation generates light, such light is essentially sent out in all directions and could reach a multitude of sensitive areas 13 thereby giving rise to a poor signal-to-noise ratio (i.e. low contrast) of the image read out from the device 10. However, due to a minimum of interchange of light between adjacent crystals, let alone crystals remote from such adjacent crystals, any light generated by X-ray radiation entering a respective crystal 17 will reach the sensitive area associated with such crystal 17 or not reach any sensitive area at all. Thus, the signal-to-noise ratio will be greatly improved. By matching the pattern of lands 16 to the matrix pattern of sensitive areas 13 of the semiconductive matrix 11, no crystals result between the sensitive areas 13.

It is known from previous attempts (See e.g. Japanese patent application No. 59-122988) to generate an undefined crack-pattern in the CsI layer. Thereby, inevitably a portion (in case of the Japanese application), about 75% of the crystals do not form above the sensitive areas. By providing a protective layer 12 with a pattern of grooves and lands matching the pattern of insensitive and radiation sensitive areas 13, respectively, a greatly enhanced efficiency radiographic image detection device is achieved, because any X-ray radiation, be it directed to a sensitive area or be it directed to the insensitive area surrounding such sensitive area gives rise to light that reaches the sensitive area.

The grooves formed in the protective layer 12 are of a width of 10 to 20 micrometers and a depth of 10 to 20 micrometers suitable for obtaining different crystal orientations of CsI which may be applied by vapor deposition on the lands or land portions 16 of the protective layer 12.

Although for TDI applications use will be made of a matrix image-recording element comprised of a number of rows and a number of columns, it is also possible for other radiographic applications, in particular when a high source load is of no disadvantage, to use the matrix comprised of only one row of image-recording elements located next to each other, each image-recording element forming a "column". The advantages of the method according to the present invention with such a matrix comprised of one row are the same as those with a matrix comprised of several rows.

While the invention has been described in connection with an exemplary embodiment thereof, it will be understood that many modifications will be apparent to those of ordinary skill in the art; and that this application is intended to cover any adaptations of variations thereof. Therefore, it is manifestly intended that this invention be only limited by the claims and the equivalents.

What is claimed:

1. A radiographic image detection device, which comprises:
    a semiconductive matrix having rows and columns of radiation sensitive areas;
    a protective layer formed on a surface of said semiconductive matrix of lands portions defined by grooves corresponding to areas between said rows and columns of said radiation sensitive areas; and
    crystals capable of adsorbing X-ray radiation disposed on said lands portions of said protective layer.

2. The radiographic image detection device as defined in claim 1 wherein said protective layer is formed of Si$_3$N$_4$.

3. The radiographic image detection device defined in claim 1 or 2 wherein said grooves are of a width and depth of from 10 to 20 $\mu$m.

4. The radiographic image detection device as defined in claim 3 wherein said said crystals capable of adsorbing X-ray radiation are of cesium iodide.

5. The radiographic image detection device as defined in claim 4 wherein said crystals of cesium iodide are formed by vapor deposition.

* * * * *